United States Patent
Koenig et al.

(10) Patent No.: US 8,913,704 B2
(45) Date of Patent: Dec. 16, 2014

(54) METHOD AND SYSTEM FOR JITTER REDUCTION

(75) Inventors: Dietmar Koenig, Munich (DE); Harald Schmid, Villach (AT); Thomas Steinecke, Hofsingelding (DE)

(73) Assignee: Infineon Technologies AG, Neubiberg (DE)

( * ) Notice: Subject to any disclaimer, the term of this patent is extended or adjusted under 35 U.S.C. 154(b) by 600 days.

(21) Appl. No.: 13/175,520

(22) Filed: Jul. 1, 2011

(65) Prior Publication Data

US 2013/0003906 A1    Jan. 3, 2013

(51) Int. Cl.
*H04L 7/00* (2006.01)
*H03K 5/1252* (2006.01)
*H03K 7/06* (2006.01)

(52) U.S. Cl.
CPC ............... *H03K 7/06* (2013.01); *H03K 5/1252* (2013.01)
USPC ............................ 375/371; 375/246; 375/296

(58) Field of Classification Search
CPC .................... H04B 2215/067; H04B 2215/064
USPC ........................................... 375/296, 246, 371
See application file for complete search history.

(56) References Cited

U.S. PATENT DOCUMENTS

| | | | |
|---|---|---|---|
| 2001/0020862 A1* | 9/2001 | Takaki | 327/291 |
| 2003/0177409 A1* | 9/2003 | Greenstreet | 713/401 |
| 2008/0107154 A1* | 5/2008 | Hsiao-Chyi | 375/130 |
| 2008/0273574 A1* | 11/2008 | Carley et al. | 375/130 |
| 2011/0026655 A1* | 2/2011 | Crawley et al. | 375/359 |

* cited by examiner

*Primary Examiner* — Shuwang Liu
*Assistant Examiner* — David S Huang
(74) *Attorney, Agent, or Firm* — Eschweiler & Associates, LLC (57) ABSTRACT

Embodiments relate to systems and methods for reducing jitter caused by frequency modulation of a clock signal including modulating the frequency of the clock signal based on a predetermined modulation signal m(t), and compensating an accumulated jitter J(t) caused by the frequency modulation of the clock signal such that an absolute value of the accumulated jitter J(t) never exceeds a predetermined jitter limit $J_{lim}$.

24 Claims, 4 Drawing Sheets

METHOD AND SYSTEM FOR JITTER REDUCTION

FIELD

The present invention relates generally to a method and system for reducing jitter, and, in particular, to reducing jitter in automotive systems in the context of improving electromagnetic compatibility (EMC).

BACKGROUND

In recent years, EMC has gained an ever increasing impact on the success of products in the automotive area. Despite constantly rising requirements with regard to the performance of such products normally entailing an increased electromagnetic activity, their EMC characteristics have to improve as well. For this purpose, new methods and systems for improving EMC characteristics are required.

A conventional and accepted method for improving EMC characteristics is based on frequency modulation of the clock signal within electronic circuits. However, this method bears the disadvantage that —due to the frequency modulation— the error of the clock signal (jitter) is increased.

Specifically, for a frequency modulation of the clock signal that significantly contributes to improved EMC characteristics, the jitter increases by an amount which may cause that common communication interfaces do no longer operate correctly.

For instance, an acceptable jitter of a clock signal for a system comprising an exemplary communication interface may lie in the order of 10 to 15 ns. To this jitter budget a corresponding conventional clock source which is not frequency modulated may already contribute a jitter of 1 to 5 ns.

However, a frequency modulation of said clock source with a relatively low modulation frequency $f_{MOD}$=100 kHz compared to the frequency of the clock signal $f_{CLK}$=400 MHz and a modulation amplitude MA=2% causes a mean additional modulation jitter of 50 ns, as an example according to the equation $$\text{Jitters[ns]} = \frac{2500 \times MA[\%]}{f_{mod}[\text{kHz}]}$$

for triangular modulation.

Hence, the total jitter of the modulated clock source ranges between 51 ns and 55 ns which clearly exceeds the above-mentioned acceptable jitter budget of 10 to 15 ns. This precludes the modulated clock source from being used for the exemplary communication interface.

As a result, frequency modulation has not been used in many applications such as for example automotive applications at a mass production level.

Instead, different previous solutions have been established that are based on a second independent and precise clock signal to reduce the jitter of a first clock signal. However, these prior art solutions bear several disadvantages. For instance, they require a further phase locked loop (PLL) just for the above-mentioned purpose. This—in turn—is only available at the cost of increased power consumption and an increased demand for area on an integrated circuit.

For these or other reasons, there is a need for the present invention.

SUMMARY

A method and system for reducing jitter is provided, substantially as shown in and/or described in connection with at least one of the figures, as set forth more completely in the claims.

Further features and advantages of embodiments will become apparent from the following detailed description made with reference to the accompanying drawings.

BRIEF DESCRIPTION OF THE DRAWINGS

The accompanying drawings are included to provide a further understanding and are incorporated in and constitute a part of this specification. The drawings relate to embodiments and together with the description serve to explain the principles of the invention. Other embodiments and many of the intended advantages of embodiments will be readily appreciated as they become better understood by reference to the following detailed description.

DETAILED DESCRIPTION

In the following Detailed Description, reference is made to the accompanying drawings, which form a part hereof, and in which are shown by way of illustration specific embodiments. It is to be understood that other embodiments may be utilized and structural or other changes may be made without departing from the scope of the present invention. The following detailed description, therefore, is not to be taken in a limiting sense, and the scope of the present invention is defined by the appended claims.

Certain embodiments may reduce the additional jitter caused by frequency modulation of a clock signal based on a single clock source—i.e. without an additional clock signal source.

Nevertheless, the jitter may be reduced by an amount which enables the usage of frequency modulation in communication interfaces, in particular communication interfaces for automotive applications.

For this purpose, embodiments based on digital frequency modulation may use the fact that—at every instant in time—a defined and predictable clock period error signal t(t) is subtracted from a nominal clock period $T_{CLK}$ of the clock signal with a corresponding nominal frequency $f_{CLK}$=1/$T_{CLK}$.

Generally, practically every clock signal bears an inevitable inaccuracy of the periodicity of its clock edges. With increasing progress in time, this leads to an original accumulated jitter of the clock signal that may be defined by a value ±x.

Moreover, certain applications—such as improving the electromagnetic compatibility of electronic circuits—involve a modulation of the frequency of the clock signal used in said circuits. In other words, the duration of the clock periods $T_{CLK}$ is additionally and intentionally varied over time.

This adds a further error to the instances in time of the clock edges characterized by a value ∓y to the original accumulated jitter.

Embodiments enable to transform said further error from ∓y to a non-positive accumulated jitter −2y and to limit an absolute value of said non-positive accumulated jitter |−2y| to a maximum value $J_{lim}$. Said maximum value $J_{lim}$ may be chosen to fulfill the requirements of a specific application such as the requirements of a communication interface.

Figure 1:
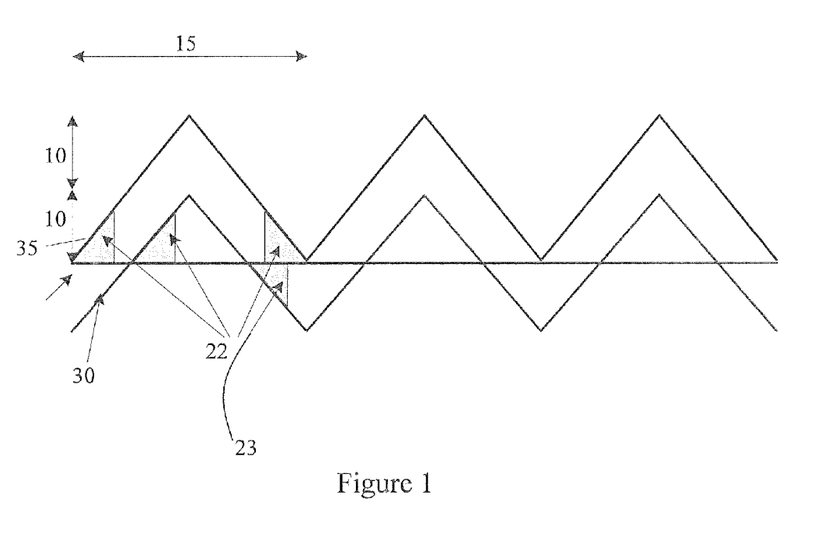
FIG. 1 shows a schematic comparison of time courses of a conventional signal and a signal according to an embodiment used to modulate the frequency of a clock signal.

The upper graph 35 of FIG. 1 shows a schematic time course of a signal according to an embodiment on which said defined and predictable clock period error signal t(t) is based which is subtracted from the nominal clock period $T_{CLK}$ for modulating the frequency $f_{CLK}$ of a clock signal.

This signal may be interpreted as time varying frequency error signal f(t) which corresponds to said clock period error signal t(t) which is used to modulate the clock period $T_{CLK}$ of the clock signal to provide a frequency modulation of the latter.

According to other embodiments, the signals as shown in FIG. 1 may also be interpreted as time varying modulation signals m(t) or modulation functions. These time varying modulation signals m(t) may then be multiplied with the clock period $T_{CLK}$ of the clock signal and subtracted from the nominal clock period $T_{CLK}$. This provides time varying instantaneous clock periods $T_{CLK}(t)$ or—in other words—the intended frequency modulation of the clock signal.

Hence, the instantaneous clock period $T_{CLK}(t)$ may be defined as $T_{CLK}(t)=T_{CLK}-T_{CLK}\cdot m(t)$, wherein the modulation signal m(t) comprises a modulation amplitude MA. In embodiments, this modulation amplitude MA may be defined by a percentage of the nominal clock period $T_{CLK}$ and may typically range between 1 to 3%.

Now with respect to FIG. 1, the lower graph 30 forms a periodic triangular function and represents an example signal for frequency modulation effecting a conventional frequency modulation. The ordinate of FIG. 1 indicates the frequency modulation amplitude which corresponds to amount of change of the frequency. The abscissa of FIG. 1 indicates the time t.

This signal for conventional frequency modulation exhibits a frequency modulation amplitude 10 and a frequency modulation period 15.

Furthermore, the signal for conventional frequency modulation is arranged symmetrically with regard to a mean frequency. The mean frequency is defined as the frequency at the crossing point of the abscissa and the ordinate in FIG. 1. As a result, it exhibits time sections in which its positive values cause that the corresponding instantaneous clock periods $T_{CLK}(t)$ of the modulated clock signal are smaller than the nominal clock period $T_{CLK}$ of the modulated clock signal.

However, the lower graph 30 also exhibits time sections in which its negative values cause that the corresponding instantaneous clock periods $T_{CLK}(t)$ of the modulated clock signal are larger than the nominal clock period $T_{CLK}$ of the modulated clock signal.

Since the accumulated jitter J(t) is defined by the integral of the difference of the instantaneous clock period $T_{CLK}(t)$ to the nominal clock period $T_{CLK}$ over time $$J(t) = \int_0^t (T_{CLK}(t) - T_{CLK})dt,$$

said positive values and said negative values of the signal for classical frequency modulation cause time periods with negative accumulated jitter 22 J(t) as well as time periods with positive accumulated jitter 23 J(t) respectively.

In this regard, the corresponding shaded areas below and above the lower graph 30 and the upper graph 35 in FIG. 1 represent a measure for said integral, i.e. a measure for said negative accumulated jitter 22 J(t) and said positive accumulated jitter 23 J(t).

In contrast to the lower graph 30 in FIG. 1, the upper graph 35 represents a signal for frequency modulation according to an embodiment.

With regard to this embodiment, the upper graph 35 also forms a periodic triangular function but is shifted upwards by an equivalent of the modulation amplitude 10. As a result, the signal for frequency modulation according to the upper graph 35 is continuously non-negative.

This causes that the instantaneous clock period $T_{CLK}(t)$ of the modulated clock signal as modulated according to the upper graph 35 never exceeds the nominal clock period $T_{CLK}$ of the modulated clock signal. Consequently, the accumulated jitter J(t) caused by the modulated clock signal as modulated according to the upper graph 35 is restricted to non-positive values.

More specifically, in comparison with the lower graph 30 in FIG. 1, the sections of the latter with negative values of the signal for frequency modulation and correspondingly resulting positive accumulated jitter values J(t) do no longer appear with respect to the upper graph 35.

Instead, the sections with positive values of the signal for frequency modulation and correspondingly resulting negative accumulated jitter values J(t) are doubled in comparison to the lower graph 30.

This restriction of the accumulated jitter J(t) to non-positive values based on non-negative frequency error signals causing the modulation of the clock period $T_{CLK}$ of a clock signal may be advantageous for the compensation, i.e. reduction of the accumulated jitter J(t) in practical applications.

A basis for this advantage is that a non-positive accumulated jitter describes a clock signal whose clock edges never occur later but mostly earlier than the clock edges of a clock signal with fixed clock periods, i.e. of a clock signal without jitter.

In other words and with respect to a non-positive accumulated jitter caused by frequency modulation of a clock signal, the modulated clock signal is never slower but mostly faster than a clock signal without modulation jitter.

Moreover, based on a known non-negative modulation signal resulting in a modulation of the clock period of a clock signal and causing said non-positive accumulated modulation jitter J(t), it is possible to calculate in advance when the absolute value of said accumulated modulation jitter will exceed the above-mentioned predetermined jitter limit $J_{lim}$. This calculation is particularly easy when a linear modulation signal is used to modulate the clock period of the clock signal such as the signal as represented by the upper graph 35 in FIG. 1.

Hence, in one embodiment, said known non-negative modulation signal causing said non-positive accumulated modulation jitter may simplify to detect the instances in time when the clock edges of the modulated clock signal have been continuously shifted as a result of mostly smaller instantaneous clock periods $T_{CLK}(t)$ due to the frequency modulation to occur one nominal clock period $T_{CLK}$ earlier than the clock edges of a corresponding clock signal without frequency modulation.

In other words, at said instances in time, the non-positive accumulated modulation jitter causing a negative phase shift of the clock signal equivalent to one clock period $T_{CLK}$ is tantamount to an additionally generated nominal clock period $T_{CLK}$ for the modulated clock signal. As a result, at said instances in time, said non-positive accumulated modulation jitter causing a negative phase shift of the clock signal equivalent to one nominal clock period $T_{CLK}$ may easily be compensated for by dropping a clock period in the course of the modulated clock signal.

Regarding the modulated clock signal for the above-mentioned communication interface, the combination of limiting the accumulated jitter to non-positive (negative) values and compensating the accumulated jitter by dropping a clock period enables the accumulated jitter caused by frequency modulation to be scaled to a target frequency of the corresponding clock source.

While FIG. 1 shows a triangular modulation signal, it is to be noted that other types of modulation signals such as sinusoidal, rectangular or other types may be used in embodiments to obtain the accumulation of only positive jitter or non-positive jitter as described above.

With respect to the communication interface for automotive applications as described at the beginning using a clock source with a target frequency of $f_{CLK}$=400 MHz—the modulation jitter may increase to |−2.5| ns=1/$f_{CLK}$=$T_{CLK}$ at most when using the above-described jitter reduction method. This additional modulation jitter causes a total jitter between 3.5 ns and 7.5 ns which clearly lies within the acceptable jitter budget of 10 to 15 ns with respect to the example mentioned at the beginning. Hence, the described jitter reduction method re-enables the use of the corresponding clock source for said communication interface again.

Figure 2:
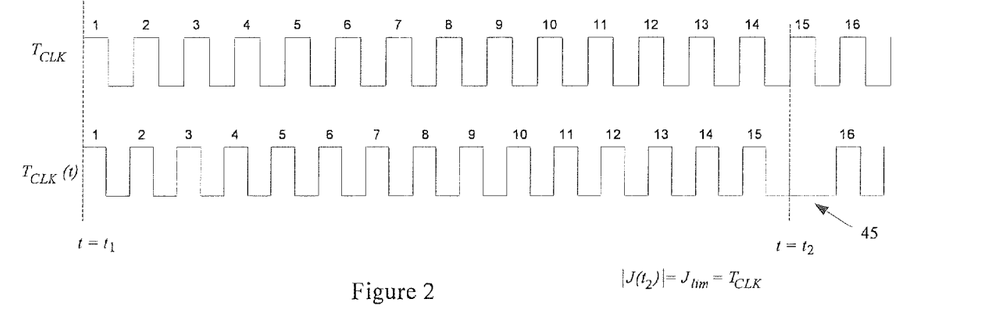
FIG. 2 shows an example of compensating an accumulated jitter J(t) equivalent to a nominal clock period $T_{CLK}$ by dropping a clock pulse according to an embodiment.

FIG. 2 shows an example of compensating an accumulated jitter J(t) equivalent to a nominal clock period $T_{CLK}$ by dropping a clock pulse according to an embodiment. More specifically, the upper part of FIG. 2 shows the nominal clock signal without frequency modulation and with the nominal clock period $T_{CLK}$.

To enable an easy comparison with the nominal clock signal, the lower part of FIG. 2 shows a simplified modulated clock signal. For the sake of simplicity, the modulated clock signal comprises a fixed frequency offset leading to fixed modulated clock periods which are slightly smaller than the nominal clock period $T_{CLK}$.

As a result, the rising edges of the clock pulses of the modulated clock signal are increasingly earlier with respect to the rising edges of the corresponding clock pulses of the nominal clock signal, wherein corresponding clock pulses are designated with corresponding numbers. In other words, in the depicted embodiment, the accumulated jitter J(t) of the modulated clock signal decreases linearly with time.

In the example of FIG. 2, the jitter limit $J_{lim}$ is set to one nominal clock period $T_{CLK}$. Eventually—more specifically at time t=$t_2$—the absolute value of the accumulated jitter J(t) reaches this predetermined jitter limit $J_{lim}$, namely a full nominal clock period $T_{CLK}$.

In response to reaching said jitter limit $J_{lim}$, a clock pulse to occur after the fifteenth clock pulse is dropped in the course of the modulated clock signal. The dropped clock pulse causes that the phase relation of the train of clock pulses of the modulated clock signal is reset with regard to the train of clock pulses of the nominal clock signal with respect to a predetermined instance in time, here t=$t_1$. In other words, the accumulated jitter J(t) caused by the frequency modulation is reset to zero by the dropping of the clock pulse.

As a result, the sixteenth clock pulse of the modulated clock signal is approximately realigned with the sixteenth clock pulse of the nominal clock signal in terms of time.

In the example of FIG. 2, the dropping of the clock pulse to occur after the fifteenth clock pulse may be implemented by masking the clock pulse 45 of the modulated clock signal by a logic gate to be set to zero.

Figure 3:
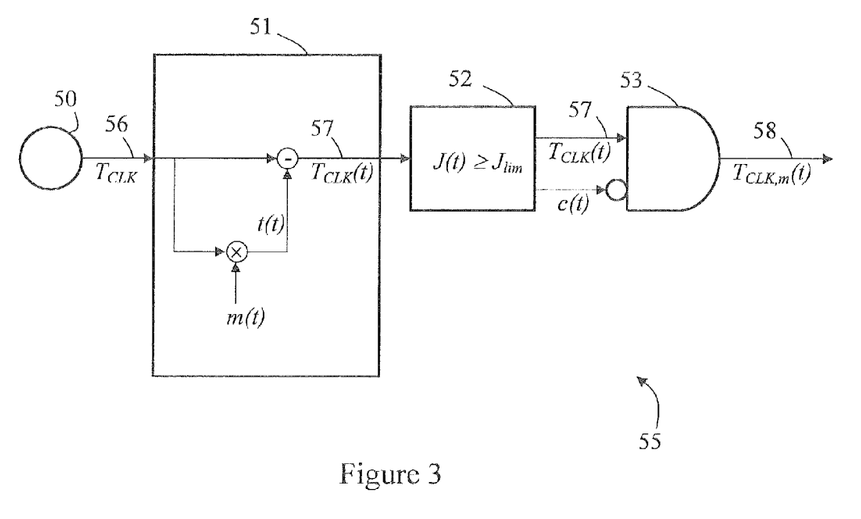
FIG. 3 shows an embodiment of a system for reducing jitter caused by frequency modulation of a clock signal.

FIG. 3 shows an embodiment of a system 55 for reducing jitter caused by frequency modulation of a clock signal. The system 55 according to FIG. 3 comprises a clock signal source 50 which generates a nominal clock signal 56 with a nominal frequency $f_{CLK}$ or a nominal clock period $T_{CLK}$. The clock signal source 50 feeds the nominal clock signal 56 to a frequency modulator 51 as further part of the system 55.

The frequency modulator 51 is adapted to modulate the frequency of the nominal clock signal 56 by subtracting a predetermined time varying clock period error signal t(t) which always comprises the same algebraic sign from the nominal clock signal 56 with the nominal clock period $T_{CLK}$. This yields a modulated clock signal 57 with instantaneous clock periods $T_{CLK}$(t) which exhibits an accumulated jitter J(t) caused by the frequency modulation over time that always comprises the same algebraic sign, too.

In the embodiment of FIG. 3, the frequency modulator 51 is adapted to generate the time varying clock period error signal t(t) by multiplying the nominal clock signal 56 with a time varying modulation signal m(t).

Furthermore, the modulated clock signal 57 is fed to a detector 52 as a further part of the system 55. The detector 52 is adapted to detect whenever the absolute value of the accumulated jitter J(t) caused by the frequency modulation of the modulated clock signal 57 reaches a predetermined jitter limit $J_{lim}$. In the corresponding instances of time whenever this condition is fulfilled, the detector 52 generates control pulses in the control signal c(t). In embodiments, the detector 52 may be implemented as a phase detector.

The detector 52 forwards the modulated clock signal 57 together with the control signal c(t) to a clock signal modifier 53 as a further part of the system 55. The clock signal modifier 53 is adapted to modify the modulated clock signal 57 effecting a phase shift of the modulated clock signal 57 with respect to the nominal clock signal 56 compensating the accumulated jitter J(t) whenever the absolute value of the accumulated jitter J(t) reaches the predetermined jitter limit $J_{lim}$.

In the embodiment of FIG. 3, the predetermined jitter limit $J_{lim}$ equals one nominal clock period $T_{CLK}$. This limit, however, may take on other values. Moreover, the clock signal modifier 53 in this embodiment comprises an AND-gate logically linking the modulated clock signal 57 and an inverted version of the control signal c(t) to yield a modified modulated clock signal 58.

In operation, logically linking the modulated clock signal 57 and the inverted version of the control signal c(t) by the AND-gate operates to effect the dropping of a clock pulse in the train of clock pulses of the modulated clock signal 57 to compensate an accumulated jitter J(t) equivalent to the predetermined jitter limit $J_{lim}$, here the nominal clock period $T_{CLK}$.

In the embodiment of FIG. 3, the dropping of the clock pulse may be implemented by masking a clock pulse by the AND-gate of the clock signal modifier 53 to be set to zero whenever the absolute value of the accumulated jitter J(t) reaches the equivalent of the nominal clock period $T_{CLK}$.

Figure 4:
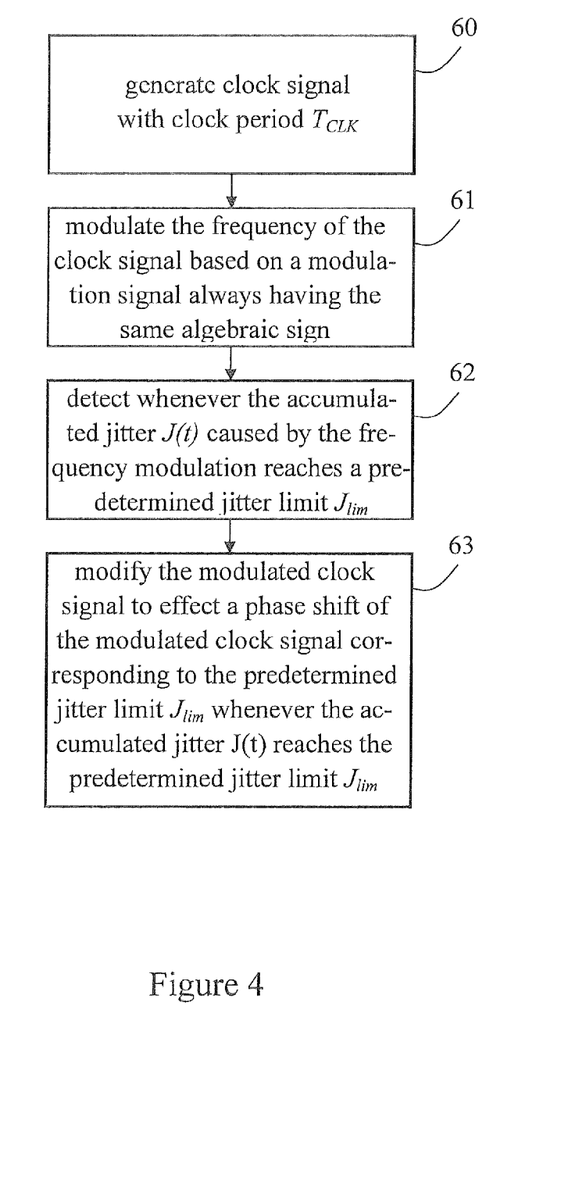
FIG. 4 shows an embodiment of a method for reducing jitter caused by frequency modulation of a clock signal.

FIG. 4 shows an embodiment of a method for reducing jitter caused by frequency modulation of a clock signal. In step 60 of the method, a nominal clock signal with a nominal clock period $T_{CLK}$ is generated.

In step 61 of the method, the frequency of the generated nominal clock signal is modulated based on a modulation signal m(t) which, in one embodiment, always has the same algebraic sign to yield a modulated clock signal.

In step 62 of the method, it is detected whenever the absolute value of the accumulated jitter J(t) of the modulated clock signal caused by the frequency modulation reaches a predetermined jitter limit $J_{lim}$.

Moreover, in step 63 of the method as shown in FIG. 4, the modulated clock signal is modified to effect a phase shift of the modulated clock signal with respect to the nominal clock signal to compensate for the accumulated jitter J(t) whenever the absolute value of the accumulated jitter J(t) reaches the predetermined jitter limit $J_{lim}$.

Moreover, other embodiments have a non-positive modulation signal effecting instantaneous clock periods $T_{CLK}(t)$ that are larger than the nominal clock period $T_{CLK}$ such that an exclusively non-negative accumulated modulation jitter J(t) is caused.

In this case, the non-negative accumulated jitter causes a predetermined positive phase shift of the clock edges of the modulated clock signal relative to the clock edges of a clock signal without frequency modulation over time. This phase shift may be compensated by effecting a complementary (here negative) phase shift of the clock signal, for instance, whenever the accumulated jitter J(t) has reached said predetermined jitter limit $J_{lim}$.

In some embodiments, a predetermined arbitrary modulation signal—effecting instantaneous clock periods $T_{CLK}(t)$ which may have both smaller and larger values than the nominal clock period $T_{CLK}$ over time—in sum causes a resultant accumulated modulation jitter which—over time—may have both negative and positive values.

Also in this case, the predetermined arbitrary modulation signal via the resultant accumulated jitter causes a predetermined resultant phase shift of the clock edges of the modulated clock signal relative to the clock edges of a clock signal without frequency modulation over time. Again, this resultant phase shift may be compensated by effecting a complementary phase shift of the clock signal.

Turning back to the above-described embodiments which relate to the Figures, it is emphasized that the embodiments basically serve to increase the comprehensibility. In addition to that, the following further embodiments try to illustrate a more general concept. However, also the following embodiments are not to be taken in a limiting sense. Rather—as expressed before—the scope of the present invention is defined by the appended claims.

In this regard, a first embodiment relates to a system for reducing jitter caused by frequency modulation of a clock signal comprising a single clock signal source generating the clock signal with a frequency $f_{CLK}$. This system further comprises a frequency modulator adapted to modulate the frequency of the clock signal by subtracting a predetermined time varying non-negative clock period error signal t(t) from a clock period $T_{CLK}$ of the clock signal to cause a non-positive accumulated jitter J(t) of the clock signal over time.

Moreover, the system comprises a detector adapted to detect whenever the absolute value of the accumulated jitter J(t) reaches a predetermined jitter limit $J_{lim}$. Furthermore, the system comprises a clock signal modifier adapted to modify the clock signal effecting a positive phase shift of the clock signal corresponding to the predetermined jitter limit $J_{lim}$ whenever the absolute value of the accumulated jitter J(t) reaches the predetermined jitter limit $J_{lim}$.

In one example, a phase detector—e.g. the phase detector of an available PLL—may be used as the detector adapted to detect whenever the absolute value of the accumulated jitter J(t) reaches a predetermined jitter limit $J_{lim}$. For instance, a phase shift in the phase error detected by the phase detector may be used to detect whenever the phase error exceeds a full clock period $T_{CLK}$ of the clock signal corresponding to the absolute value of the accumulated jitter J(t) reaching a predetermined jitter limit $J_{lim}$.

In a further embodiment, the predetermined jitter limit $J_{lim}$ equals a predetermined integer number of clock periods $T_{CLK}=1/f_{CLK}$ of the clock signal. This may be advantageous with respect to compensating for the accumulated jitter J(t) caused by frequency modulation. For instance, the compensation may be performed by simply dropping a corresponding integer number of clock periods $T_{CLK}$ to keep the total accumulated jitter of the clock signal within a predetermined jitter budget.

According to another embodiment, the predetermined jitter limit $J_{lim}$ equals the equivalent of one (nominal) clock period $T_{CLK}=1/f_{CLK}$ of the clock signal. In this embodiment the clock signal modifier is adapted to drop one clock period $T_{CLK}$ of the clock signal to compensate for the accumulated jitter J(t) whenever an absolute value of the accumulated jitter J(t) reaches the predetermined jitter limit $J_{lim}$ equivalent to a clock period $T_{CLK}$, i.e. whenever $|J(t)|=J_{lim}=T_{CLK}$.

Hence, choosing the predetermined jitter limit to equal the equivalent of one clock period $T_{CLK}$ the clock signal allows that the clock signal modifier may be simplified to perform merely dropping of a single clock period $T_{CLK}$ from the modulated clock signal. This may be implemented using a simple logic gate such as an AND-gate for passing the clock signal to the respective circuit.

In an embodiment, the clock period error signal t(t) effects a frequency modulation with an arbitrary predetermined frequency modulation amplitude, an arbitrary predetermined modulation frequency $f_{MOD}$ and/or an arbitrary predetermined type of frequency modulation. In other words, the corresponding systems for reducing jitter caused by frequency modulation are advantageous in that they may be used independent of the modulation amplitude, the modulation frequency $f_{MOD}$ and the type of frequency modulation of the signal used to modulate the period of the clock signal.

According to a further embodiment, the clock period error signal t(t) corresponds to a periodic triangular function with the period $T_{MOD}=1/f_{MOD}$ and varying between 0 and two times a frequency modulation amplitude MA, wherein $T_{CLK}(t)$ is the instantaneous period of the clock signal:

$t(t) = T_{CLK} \cdot m(t)$ wherein $T_{CLK}(t) = T_{CLK} - t(t)$ and $m(t) =$ $$\begin{cases} \dfrac{4}{T_{MOD}} MA \cdot (t - (n-1) \cdot T_{MOD}) & T_{MOD} \cdot (n-1) \le t < \dfrac{T_{MOD}}{2} \cdot (2n-1) \\ \dfrac{4}{T_{MOD}} MA \cdot (n \cdot T_{MOD} - t) & \dfrac{T_{MOD}}{2} \cdot (2n-1) \le t < T_{MOD} \cdot n \end{cases}$$

$n \in |N$

The above embodiment is advantageous in that the equally periodic triangular modulation signal m(t) is easy to generate and allows for a simplified detection or calculation when the resulting absolute value of the accumulated jitter J(t) reaches the predetermined jitter limit $J_{lim}$.

Moreover, the above modulation signal m(t) may be related to the upper graph 35 in FIG. 1 wherein the modulation amplitude 10 equals MA and the modulation period 15 equals $T_{MOD}$.

Further embodiments relate to systems for improving electromagnetic compatibility (EMC) comprising means for causing a predetermined constantly non-positive additional accumulated jitter J(t) of a clock signal by frequency modulation of the clock signal. Moreover, the systems comprise a circuit for dropping a clock pulse effecting the compensation of an accumulated jitter equivalent to a clock period $T_{CLK}$ of the clock signal whenever the absolute value of the accumulated jitter J(t) reaches the equivalent of the clock period $T_{CLK}$.

Choosing the frequency modulation of the clock signal to effect a constantly non-positive additional accumulated jitter J(t) of a clock signal may for example be advantageous in applications where the modulation frequency $f_{MOD}$ is one order or some orders of magnitude smaller than the frequency $f_{CLK}$ of the modulated clock signal.

In particular with regard to the fact that in the corresponding systems, the jitter reduction mechanism is based on a single clock source, the constantly non-positive additional accumulated jitter J(t) which is related to a modulated clock signal that is never slower than a clock source running at the nominal frequency $f_{CLK}$, it may be easier in practical systems to track the phase relation of the modulated clock signal with respect to the clock signal without frequency modulation. This results from the fact that the phase relation may be characterized by a sum of exclusively negative phase shifts.

According to some embodiments, the circuit for dropping a clock pulse is adapted to drop clock pulses as a function of a type of the frequency modulation. This may enable a better distribution of the instances in time over a predetermined period of time at which clock pulses are dropped with regard to the characteristics of the type of the frequency modulation. It may also allow that other circuits related to the generation and/or distribution of the clock signal are not affected by the dropping of the clock pulses. In accordance to an embodiment, a control may be implemented to secure that not too many clock pulses are dropped consecutively. Such a control may for example track the number of dropped clock pulses within a predetermined period of time. Once a predetermined number of drops is exceeded in a particular period of time, the control restricts the dropping subsequently within this period of time.

In another one of the above-mentioned embodiments, the circuit for dropping a clock pulse is adapted to drop clock pulses distributed over a predetermined period of time according to a predetermined function d(t), wherein d(t) preferably comprises an equal distribution. Again, this may secure that not too many clock pulses are dropped consecutively.

In a further embodiment, the circuit for dropping a clock pulse is configurable such that an effective frequency of the clock signal never falls below a minimum frequency $f_{CLK,min}$. Also this configuration may be used to secure that not too many clock pulses are dropped consecutively.

According to yet another embodiment, the circuit for dropping a clock pulse is configurable in terms of switching the clock pulse dropping functionality on or off. This may be helpful in instances where any remaining effects of the clock pulse dropping functionality should be at least temporarily eliminated completely.

Further embodiments relate to systems for reducing additional jitter of a clock signal caused by frequency modulation of the clock signal to improve electromagnetic compatibility (EMC). In the embodiments, the system is adapted to modulate the frequency of the clock signal based on a predetermined either non-negative or non-positive modulation signal m(t), and continuously or periodically compensate an accumulated jitter J(t) caused by the frequency modulation of the clock signal by modification of the clock signal such that the absolute value of the accumulated jitter J(t) never exceeds a predetermined jitter limit $J_{lim}$.

According to embodiments, the reduction of the additional jitter caused by frequency modulation is independent of a further clock signal. This is based on the fact that the accumulated jitter always has the same sign and no further, more precise clock signal is needed to track an accumulated jitter with varying signs in particular over a longer period of time corresponding to a larger number of clock periods.

In another one of the above-mentioned embodiments, the frequency modulation of the clock signal and the compensation of the resulting accumulated jitter J(t) are performed such that the characteristics of the clock signal are substantially unchanged with respect to a corresponding clock signal without frequency modulation.

In a further embodiment, the system is adapted to drop a clock pulse effecting the compensation of an accumulated jitter equivalent to a clock period $T_{CLK}$ of the clock signal whenever the absolute value of the accumulated jitter J(t) reaches the equivalent of the clock period $T_{CLK}$. Furthermore, according to the embodiment, the system is adapted to perform the clock pulse dropping functionality such that the characteristics of the clock signal are substantially unchanged with respect to a corresponding clock signal without frequency modulation in terms of an average number of clock edges in a predetermined period of time, phase information and analog jitter characteristics of the clock signal.

Further embodiments relate to methods for reducing jitter caused by frequency modulation of a clock signal, comprising modulating the frequency of the clock signal based on a predetermined modulation signal m(t), and compensating an accumulated jitter J(t) caused by the frequency modulation of the clock signal such that the absolute value of the accumulated jitter J(t) never exceeds a predetermined jitter limit $J_{lim}$.

According to embodiments, compensating the accumulated jitter J(t) comprises dropping a clock pulse effecting the compensation of an accumulated jitter equivalent to a clock period $T_{CLK}$ of the clock signal whenever an absolute value of the accumulated jitter J(t) reaches the equivalent of the clock period $T_{CLK}$.

In another one of the above-mentioned embodiments, clock pulses are dropped as a function of a type of the frequency modulation.

In a further embodiment, clock pulses are dropped distributed over a predetermined period of time according to a predetermined function d(t), wherein d(t) preferably comprises an equal distribution.

A still further embodiment comprises compensating an error in a calculation regarding when to drop a clock pulse caused by overshoots or undershoots of the modulated frequency of the clock signal at inflection points of the modulation signal m(t) by modifying the calculation when to drop a clock pulse or by modifying the modulation signal m(t) in terms of a flattening at the inflection points.

Further embodiments relate to methods for jitter reduction comprising subtracting a predetermined time varying clock period error signal t(t) always having the same algebraic sign from a clock period $T_{CLK}$ of a single clock source to cause an accumulated jitter J(t) always having the same algebraic sign of a corresponding clock signal over time, and modifying the clock signal effecting a predetermined phase shift of the clock signal corresponding to a predetermined jitter limit $J_{lim}$ whenever an absolute value of the accumulated jitter J(t) reaches the predetermined jitter limit $J_{lim}$.

According to one of the latter embodiments, the modifying of the clock signal is performed distributed over a predetermined period of time according to a predetermined function d(t), wherein d(t) comprises, for example, an equal distribution.

In another one of the above-mentioned embodiments, the reduction of the additional jitter caused by frequency modulation is independent of a further clock signal.

In still another one of the above-mentioned embodiments, the clock period error signal t(t) effects a frequency modulation with an arbitrary predetermined modulation amplitude, an arbitrary predetermined modulation frequency $f_{MOD}$ and/or an arbitrary predetermined modulation type.

In a further embodiment, the predetermined jitter limit $J_{lim}$ equals the equivalent of one period $T_{CLK}=1/f_{CLK}$ of the clock signal, wherein modifying the clock signal comprises dropping a clock pulse effecting the compensation of an accumulated jitter equivalent to a clock period $T_{CLK}$ whenever the absolute value of the accumulated jitter J(t) reaches the predetermined jitter limit $J_{lim}$ equivalent to a clock period $T_{CLK}$, i.e. whenever $|J(t)|=J_{lim}=T_{CLK}$.

In a still further embodiment, modifying the clock signal further comprises performing the clock pulse dropping such that the characteristics of the clock signal are substantially unchanged with respect to a corresponding clock signal without frequency modulation in terms of an average number of clock edges in a predetermined period of time, phase information and/or analog jitter characteristics of the clock signal.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A system for reducing jitter caused by frequency modulation of a clock signal comprising:
   a clock signal source configured to generate the clock signal with a frequency $f_{CLK}$;
   a frequency modulator configured to modulate the frequency of the clock signal by subtracting a predetermined time varying non-negative clock period error signal t(t) from a clock period $T_{CLK}=1/f_{CLK}$ of the clock signal to cause a non-positive accumulated jitter J(t) of the clock signal over time;
   a detector configured to detect whenever an absolute value of the accumulated jitter J(t) reaches a predetermined jitter limit $J_{lim}$; and
   a clock signal modifier configured to modify the clock signal effecting a positive phase shift of the clock signal corresponding to the predetermined jitter limit $J_{lim}$ whenever the absolute value of the accumulated jitter J(t) reaches the predetermined jitter limit $J_{lim}$.

2. The system of claim 1, wherein the predetermined jitter limit $J_{lim}$ equals a predetermined integer number of clock periods $T_{CLK}=1/f_{CLK}$ of the clock signal.

3. The system of claim 1, wherein the predetermined jitter limit $J_{lim}$ equals the equivalent of a clock period $T_{CLK}=1/f_{CLK}$ of the clock signal, and wherein the clock signal modifier is configured to drop a clock period $T_{CLK}$ of the clock signal to compensate for the accumulated jitter J(t) whenever the absolute value of the accumulated jitter J(t) reaches the predetermined jitter limit $J_{lim}$ equivalent to a clock period $T_{CLK}$.

4. The system of claim 1, wherein the clock period error signal t(t) effects a frequency modulation of the clock signal with an arbitrary predetermined modulation amplitude, an arbitrary predetermined modulation frequency $f_{MOD}$ and/or an arbitrary predetermined type of frequency modulation.

5. The system of claim 1, wherein the clock period error signal t(t) is determined by a periodic triangular modulation signal m(t) with the period $T_{MOD}=1/f_{MOD}$ and varying between 0 and two times a modulation amplitude MA, wherein $T_{CLK}(t)$ is an instantaneous period of the clock signal:

$t(t) = T_{CLK} \cdot m(t)$ wherein $T_{CLK}(t) = T_{CLK} - t(t)$ and $$m(t) = \begin{cases} \frac{4}{T_{MOD}} MA \cdot (t - (n-1) \cdot T_{MOD}) & T_{MOD} \cdot (n-1) \le t < \frac{T_{MOD}}{2} \cdot (2n-1) \\ \frac{4}{T_{MOD}} MA \cdot (n \cdot T_{MOD} - t) & \frac{T_{MOD}}{2} \cdot (2n-1) \le t < T_{MOD} \cdot n \end{cases}$$

$n \in |N$.

6. A system comprising:
   a circuit configured to cause a predetermined constantly non-positive additional accumulated jitter J(t) of a clock signal by frequency modulation of the clock signal;
   a detector circuit configured to detect, after modulation, whether an absolute value of the accumulated jitter J(t) reaches an equivalent of the clock period $T_{CLK}$ of the clock signal, and
   a circuit configured to drop a clock pulse effecting a compensation of the accumulated jitter equivalent to the clock period $T_{CLK}$ of the clock signal when the detector detects that the absolute value of the accumulated jitter J(t) reaches the equivalent of the clock period $T_{CLK}$.

7. The system of claim 6, wherein the circuit to drop a clock pulse is adapted to drop clock pulses as a function of a type of the frequency modulation.

8. The system of claim 6, wherein the circuit to drop a clock pulse is adapted to drop clock pulses distributed over a predetermined period of time according to a predetermined function d(t), wherein d(t) comprises an equal distribution.

9. The system of claim 6, wherein the circuit to drop a clock pulse is configurable such that an effective frequency of the clock signal never falls below a minimum frequency $f_{CLK,min}$.

10. The system of claim 6, wherein the circuit to drop a clock pulse is configurable in terms of switching the clock pulse dropping functionality on or off.

11. A system for frequency modulation of a clock signal, the system comprising:
    a modulator configured to modulate a frequency of the clock signal based on a predetermined modulation signal m(t); and
    a compensator configured to compensate an accumulated jitter J(t) caused by the frequency modulation of the clock signal by modification of the clock signal such that an absolute value of the accumulated jitter J(t) does not exceed a predetermined jitter limit $J_{lim}$, wherein the compensation comprises a reduction of the accumulated jitter caused by the frequency modulation and is independent of a further clock signal.

12. The system of claim 11, wherein the frequency modulation of the clock signal and the compensation of the accumulated jitter J(t) are performed such that characteristics of the clock signal are substantially unchanged with respect to a corresponding clock signal without frequency modulation.

13. The system of claim 11, wherein the compensator further comprises:
   a dropping circuit configured to drop a clock pulse effecting the compensation of the accumulated jitter equivalent to a clock period $T_{CLK}$ of the clock signal whenever an absolute value of the accumulated jitter J(t) reaches an equivalent of the clock period $T_{CLK}$; and
   wherein the dropping circuit is further configured to perform the clock pulse dropping functionality such that characteristics of the clock signal are substantially unchanged with respect to a corresponding clock signal without frequency modulation in terms of an average number of clock edges in a predetermined period of time, phase information and/or analog jitter characteristics of the clock signal.

14. A method for reducing jitter caused by frequency modulation of a clock signal, comprising:
   modulating a frequency of the clock signal based on a predetermined modulation signal m(t); and
   compensating for an accumulated jitter J(t) caused by the frequency modulation of the clock signal such that an absolute value of the accumulated jitter J(t) does not exceed a predetermined jitter limit $J_{lim}$, wherein the frequency modulation of the clock signal and the compensation of the accumulated jitter J(t) are performed such that characteristics of the clock signal are substantially unchanged with respect to a corresponding clock signal without frequency modulation.

15. The method of claim 14, wherein compensating for the accumulated jitter J(t) comprises dropping a clock pulse effecting the compensation of the accumulated jitter equivalent to a clock period $T_{CLK}$ of the clock signal whenever the absolute value of the accumulated jitter J(t) reaches an equivalent of the clock period $T_{CLK}$.

16. The method of claim 15, wherein clock pulses are dropped as a function of a type of the frequency modulation.

17. The method of claim 15, wherein clock pulses are dropped distributed over a predetermined period of time according to a predetermined function d(t), wherein d(t) comprises an equal distribution.

18. The method of claim 15, further comprising:
   compensating for an error in a calculation regarding when to drop a clock pulse caused by overshoots or undershoots of the modulated frequency of the clock signal at inflection points of the modulation signal m(t) by modifying the calculation when to drop a clock pulse or by modifying the modulation signal m(t) in terms of a flattening at the inflection points.

19. A method for jitter reduction comprising:
   subtracting a predetermined time varying clock period error signal t(t) from a clock period $T_{CLK}$ of a single clock source to cause an accumulated jitter J(t) of a corresponding clock signal over time, wherein the sign of t(t) is always the same and the sign of J(t) is always the same;
   detecting whether an absolute value of the accumulated jitter J(t) reaches an equivalent of the clock period $T_{CLK}$; and
   modifying the clock signal effecting a predetermined phase shift of the clock signal corresponding to a predetermined jitter limit $J_{lim}$ whenever the absolute value of the accumulated jitter J(t) reaches the predetermined jitter limit $J_{lim}$.

20. The method of claim 19, wherein modifying the clock signal is performed distributed over a predetermined period of time according to a predetermined function d(t), wherein d(t) preferably comprises an equal distribution.

21. The method of claim 19, wherein a reduction of an additional jitter caused by frequency modulation is independent of a further clock signal.

22. The method of claim 19, wherein the clock period error signal t(t) effects a frequency modulation with an arbitrary predetermined modulation amplitude, an arbitrary predetermined modulation frequency $f_{MOD}$ and/or an arbitrary predetermined modulation type.

23. The method of claim 19, wherein the predetermined jitter limit $J_{lim}$ equals the equivalent of one period $T_{CLK}=1/f_{CLK}$ of the clock signal, wherein modifying the clock signal comprises dropping a clock pulse effecting the compensation of an accumulated jitter equivalent to a clock period $T_{CLK}$ whenever the absolute value of the accumulated jitter J(t) reaches the predetermined jitter limit $J_{lim}$.

24. The method of claim 23, wherein modifying the clock signal further comprises performing the clock pulse dropping such that characteristics of the clock signal are substantially unchanged with respect to a corresponding clock signal without frequency modulation in terms of an average number of clock edges in a predetermined period of time, phase information and/or analog jitter characteristics of the clock signal.

* * * * *